United States Patent
Chan et al.

[11] Patent Number: 5,856,946
[45] Date of Patent: *Jan. 5, 1999

[54] MEMORY CELL PROGRAMMING WITH CONTROLLED CURRENT INJECTION

[75] Inventors: Vei-Han Chan; Sameer Haddad, both of San Jose; Chi Chang, Redwood City, all of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 831,571

[22] Filed: Apr. 9, 1997

[51] Int. Cl.$^6$ .................................................. G11C 16/04

[52] U.S. Cl. ................................. 365/185.19; 365/185.18

[58] Field of Search ............................ 365/185.18, 185.19

[56] References Cited

U.S. PATENT DOCUMENTS

| | | | |
|---|---|---|---|
| 5,258,949 | 11/1993 | Chang et al. | 365/185.19 |
| 5,481,492 | 1/1996 | Schoemaker | 365/185.23 |
| 5,508,958 | 4/1996 | Fazio et al. | 365/185.19 |
| 5,553,020 | 9/1996 | Keeney et al. | 365/185.19 |
| 5,590,076 | 12/1996 | Haddad et al. | 365/185.25 |
| 5,615,153 | 3/1997 | Yiu et al. | 365/185.19 |
| 5,638,320 | 6/1997 | Wong et al. | 365/185.03 |
| 5,687,118 | 11/1997 | Chang | 365/185.19 |

*Primary Examiner*—David Nelms
*Assistant Examiner*—Hoai V. Ho
*Attorney, Agent, or Firm*—Fliesler, Dubb, Meyer & Lovejoy, LLP

[57] ABSTRACT

A memory with controlled gate current injection during memory cell programming wherein programming circuitry applies a time-varying voltage to a control gate of the memory cell during a programming cycle. The time-varying voltage yields a substantially constant rate of electron flow from the channel region to the floating gate during the programming cycle.

16 Claims, 5 Drawing Sheets

MEMORY CELL PROGRAMMING WITH CONTROLLED CURRENT INJECTION

BACKGROUND OF THE INVENTION

1. Field of Invention

The present invention pertains to the field of programmable memories. More particularly, this invention relates to memory cell programming with controlled current injection.

2. Art Background

One type of programmable memory cell is commonly referred to as a flash memory cell. The structure of a typical flash memory cell includes a source region and a drain region formed in a silicon substrate. Such a flash memory cell usually includes a stacked gate structure formed on the silicon substrate. Typically, the region of the silicon substrate beneath the stacked gate structure provides a channel region of the flash memory cell.

The stacked gate structure of such a flash memory cell typically includes a pair of polysilicon structures separated by oxide layers. Typically, one of the polysilicon structures functions as a floating gate and the other polysilicon structure functions as a control gate for the flash memory cell. The oxide layer that separates the floating gate from the silicon substrate is commonly referred to as a tunnel oxide layer.

Prior programming operations on such a flash memory cell typically involve the application of a relatively large constant voltage to the drain region of the flash memory cell while an even larger constant voltage is applied to the control gate. During such a prior programming operation, the source region of the flash memory cell is typically maintained at a ground level or a zero voltage level in relation to the voltages applied to the control gate and to the drain region.

Such a relatively high voltage potential applied between the drain and source regions usually causes electron flow through the channel region from the source region to the drain region. The electrons flowing between the source and drain regions can attain relatively high kinetic energy levels near the drain region. In addition, the high constant voltage applied to the control gate typically raises the voltage potential of the floating gate to a high level at the start of the programming operation. Such a high voltage potential on the floating gate usually attracts the electrons flowing through the channel region. Under such conditions, electrons in the channel region having sufficiently high kinetic energy can migrate through the tunnel oxide layer and onto the floating gate. Such migration of electrons through the tunnel oxide layer and onto the flowing gate is commonly referred to as hot carrier programming or hot carrier injection.

Typically, such a prior programming operation involves the injection of sufficient numbers of electrons onto the floating gate to achieve a desired threshold voltage for the flash memory cell. Such a threshold voltage usually specifies a voltage that must be applied to the control gate of the flash memory cell to yield conduction through the channel region during a read operation on the flash memory cell. Typically, the time involved in a such a programming operation depends upon the rate at which electrons are injected onto the floating gate. The slower the rate of injection the longer the programming time to reach the desired threshold voltage.

With such prior programming techniques, the relatively high voltage potential of the floating gate at the start of the programming operation is typically reduced as electrons accumulate on the floating gate. Such a reduction in the voltage potential of the floating gate usually causes a corresponding reduction in the rate of electron injection onto the floating gate. Unfortunately, such a reduction in the rate of electron injection usually increases the time required to program a flash memory cell to the desired threshold voltage. Such increased programming time typically slows the overall speed of flash memory devices that employ such prior programming techniques.

In addition, it is well-known that such hot carrier programming techniques commonly result in the formation of electron-hole pairs in the channel region of the flash memory cell near the drain region. Such electron-hole pairs are typically formed as high energy electrons bombard the crystal lattice structure of the silicon substrate and dislodge other electrons from the lattice.

Moreover, the portions of the channel region near the drain region usually have a relatively high voltage potential due to the high voltage applied to the drain region. As a consequence, the voltage potential of the floating gate can fall below the voltage potential of the portion of the channel region located near the drain region as the voltage level on the floating gate decreases during programming. Under such conditions, holes from the electron-hole pairs that are created in the channel region near the drain region can migrate throughout the tunnel oxide layer and onto the floating gate.

Unfortunately, such migration of holes onto the floating gate typically causes surface damage to the tunnel oxide layer. Such surface damage usually causes long-term reliability problems in the flash memory cell by reducing the rate of injection of electrons onto the floating gate during program operations. In addition, such surface damage can interfere with current flow through the channel region of the flash memory cell during read operations which also results in a reduction in long-term reliability.

SUMMARY AND OBJECTS OF THE INVENTION

One object of the present invention is to reduce the programming cycle time of a flash memory cell.

Another object of the present invention is to improve the long-term reliability of flash memory cells across multiple programming cycles.

These and other objects are provided by a memory with controlled gate current injection. The memory includes a memory cell having a control gate and a floating gate formed over a substrate and a having a first region and a second region formed in the substrate with a channel region therebetween. The memory includes circuitry that applies a time-varying voltage to the control gate during a programming cycle on the memory cell. The time-varying voltage yields a substantially constant rate of electron flow from the channel region to the floating gate during the programming cycle.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
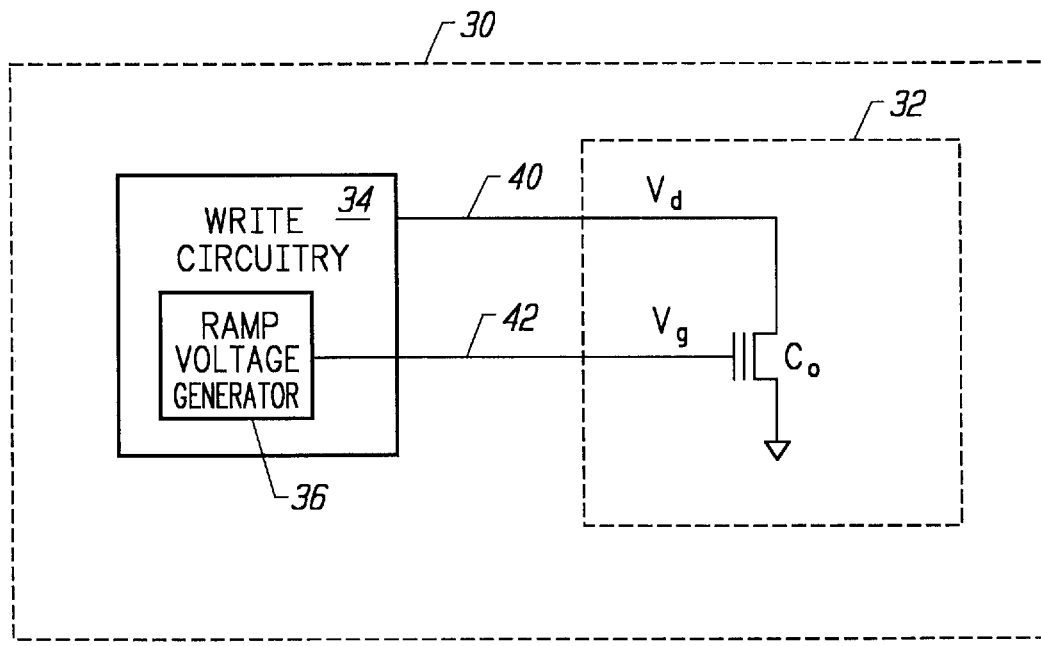
FIG. 1 illustrates a flash memory device that employs controlled current injection during programming operations.

FIG. 1 illustrates a flash memory device 30. The flash memory device 30 includes an array 32 of flash memory cells which, for purposes of illustration, shows a flash memory cell $C_0$. The flash memory device 30 includes a set of write circuitry 34 that performs programming operations on the array 32 including the flash memory cell $C_0$. Each programming operation on the flash memory cell $C_0$ is referred to as a programming cycle.

The write circuitry 34 programs the flash memory cell $C_0$ with controlled current injection by generating a time-varying control gate voltage during programming. The write circuitry 34 includes a ramp voltage generator 36. During each programming cycle, the ramp voltage generator 36 applies an increasing voltage potential to the control gate of the flash memory cell $C_0$ via the signal path 42. The increasing voltage potential to the control gate may be referred to as a ramp programming voltage or ramp function. During each programming cycle, the write circuitry 34 applies a substantially constant drain voltage to the flash memory cell $C_0$ via the signal path 40.

The voltage applied to the drain of the flash memory cell $C_0$ during programming is referred to as $V_d$ and the voltage applied to the control gate of the flash memory cell $C_0$ during programming is referred to as $V_g$. The rate of electron injection onto the floating gate of the flash memory cell $C_0$ is indicated by a gate current $I_g$ from the channel region to the floating-gate of the flash memory cell $C_0$.

The ramp voltage generator 36 gradually increases the control gate programming voltage $V_g$ during a programming cycle in order to obtain a relatively constant rate of electron injection onto the floating gate of the flash memory cell $C_0$ during the programming cycle. The relatively constant gate current $I_g$ yields a faster programming cycle for a given desired threshold voltage $V_t$ in comparison to prior art circuits that apply a constant programming voltage to the control gate during the programming cycle.

Figure 2:
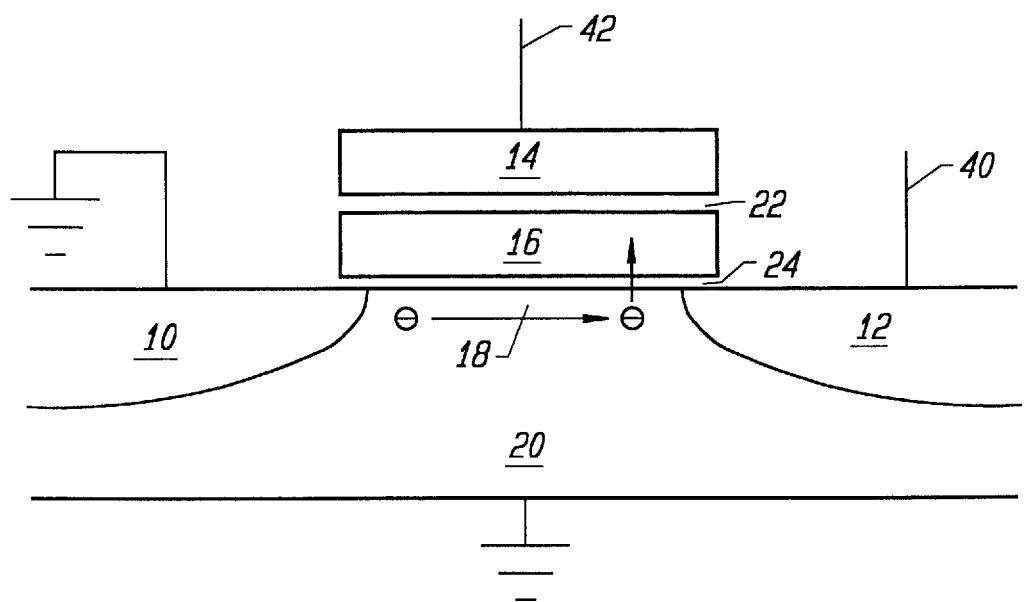
FIG. 2 illustrates the elements of the flash memory cell $C_0$ in a programming configuration.

FIG. 2 illustrates the elements of the flash memory cell $C_0$. The flash memory cell $C_0$ is formed in and onto a silicon substrate 20. In one embodiment, the silicon substrate 20 is a p-type substrate. The flash memory cell $C_0$ includes a pair of doped regions 10 and 12 formed into the silicon substrate 20. In one embodiment, the doped regions 10 and 12 are $n^+$ type doped regions. The doped region 10 functions as a source and the doped region 12 functions as a drain during programming cycles on the flash memory cell $C_0$.

The flash memory cell $C_0$ includes a stacked gate structure comprising a control gate 14 and a floating gate 16. In one embodiment, the control gate 14 and the floating gate 16 are each a polysilicon structure. The floating gate 16 is separated from an upper surface of the substrate 20 by an oxide layer 24. The oxide layer 24 may be referred to as a tunnel oxide. The control gate 14 is separated from the floating gate 16 by an oxide layer 22.

The write circuitry 24 programs the flash memory cell $C_0$ to a predetermined threshold voltage $V_t$ by applying a relatively constant drain voltage Vd to the drain region 12 while applying a ramp gate voltage $V_g(t)$ to the control gate 14. During programming cycles, the source region 10 is maintained at a ground level or low voltage level. In addition, the p-type substrate 20 is maintained at a low voltage level during programming cycles.

The constant voltage differential $V_d$ between the drain region 12 and the source region 10 causes electron flow through a channel region 18 of the flash memory cell $C_0$. Hot carrier injection occurs as high energy electrons migrate through the oxide region 24 onto the floating gate 16.

Figure 3:
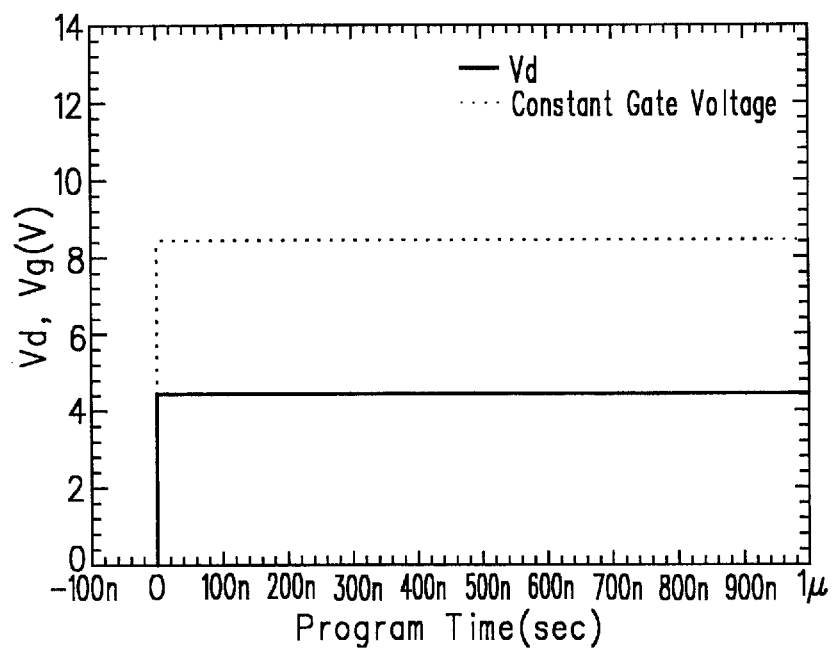
FIG. 3 illustrates the drain and control gate voltages $V_d$ and $V_g$ applied to a flash memory cell using programming techniques such as are found in the prior art.

FIG. 3 illustrates the voltages $V_d$ and $V_g$ applied to a flash memory cell using prior art programming techniques. In the prior art, both the drain voltage $V_d$ and the control gate voltage $V_g$ are usually held relatively constant during the entire programming cycle.

Figure 4:
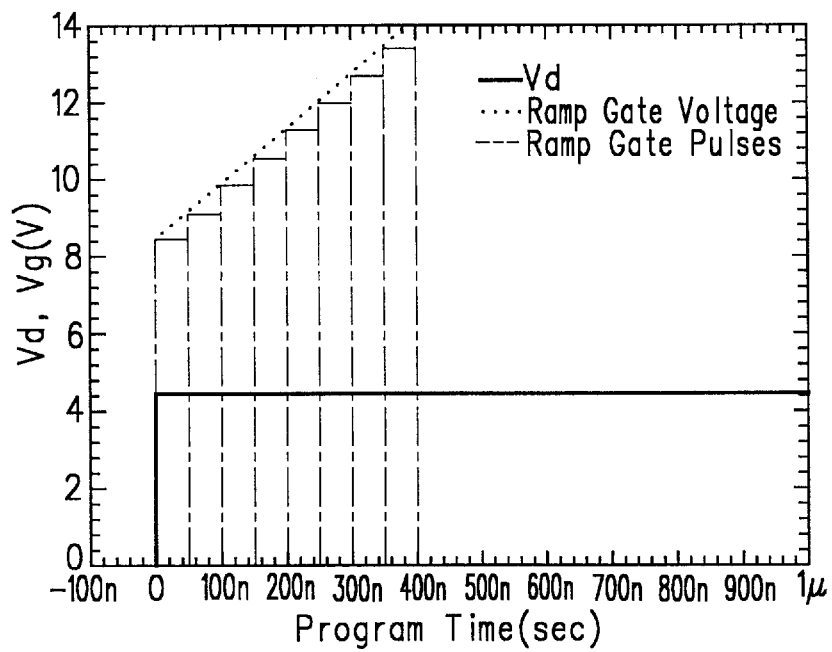
FIG. 4 illustrates the drain voltage $V_d$ and the control gate voltage $V_g$ applied to the flash memory cell $C_0$ during a programming cycle with controlled current injection.

FIG. 4 illustrates the drain voltage $V_d$ and the control gate voltage $V_g(t)$ applied by the write circuitry 24 during a controlled current injection programming cycle on the flash memory cell $C_0$. As shown, the voltage $V_g(t)$ applied to the control gate 14 steadily increases throughout the programming cycle on the flash memory cell $C_0$. During the programming cycle, the write circuitry 24 applies a constant drain voltage $V_d$ to the drain region 12.

In one embodiment, the ramp voltage generator 36 generates a linear steadily increasing gate voltage $V_g(t)$ during the programming cycle. In another embodiment, the ramp voltage generator 36 generates a series of step pulses that simulate a ramp voltage function. The series of step pulses are shown to form a staircase type waveform that increases throughout the programming cycle on the flash memory cell $C_0$.

Figure 5:
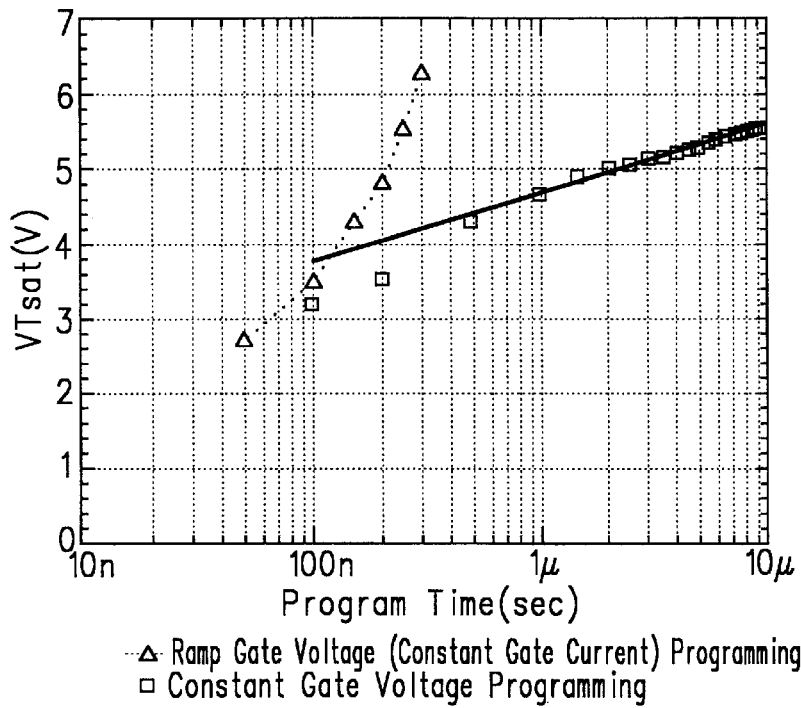
FIG. 5 illustrates the saturation region threshold voltage $VT_{sat}$ of the flash memory cell $C_0$ during programming for both prior art and controlled current injection techniques.

FIG. 5 illustrates the saturation region threshold voltage $VT_{sat}$ of the flash memory cell $C_0$ for both prior art and controlled current injection techniques. The saturation threshold voltage $VT_{sat}$ is plotted on a linear scale while the programming time is on a logarhythmic scale. The data samples represented by the triangles correspond to the application of a ramp function voltage $V_g(t)$ to the control gate 14 of the flash memory cell $C_0$ during the programming cycle. The data samples represented by the squares on the graph indicate the saturation threshold voltage for a constant voltage level applied to the control gate 14 as is done in the prior art.

Figure 6:
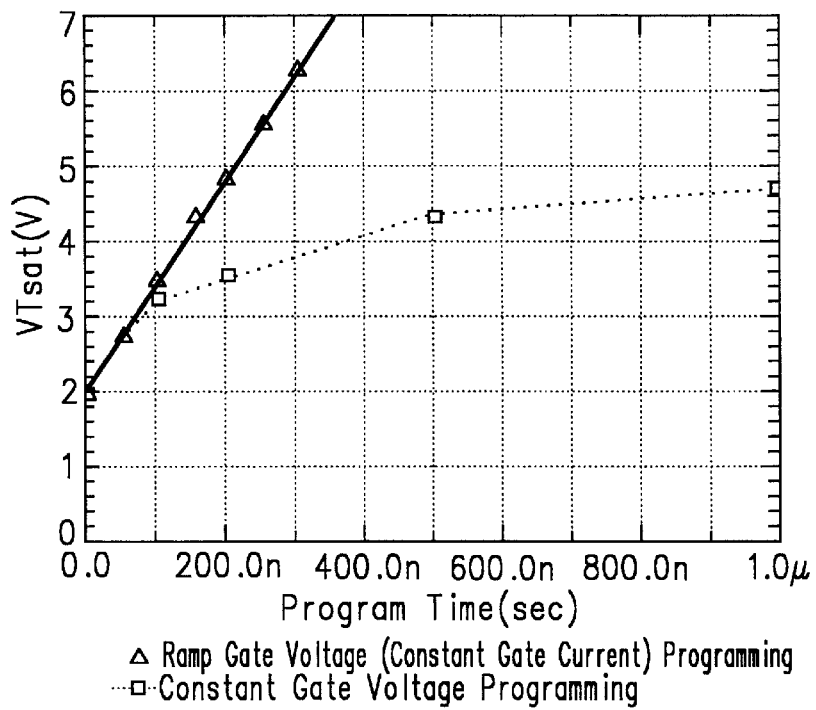
FIG. 6 is a linear-linear graph of the saturation region threshold voltage $VT_{sat}$ during programming for both prior art and controlled current injection techniques.

FIG. 6 shows the same data as FIG. 5 plotted on a linear vs. linear scale for both saturation region threshold voltage and programming time. The square samples indicate the decreasing rate at which the saturation threshold voltage $VT_{sat}$ of the flash memory cell $C_0$ increases throughout the programming cycle if a constant control gate voltage $V_g$ is applied to the control gate 14 as in the prior art. The data illustrated by the triangles shows that the saturation threshold voltage $VT_{sat}$ of the flash memory cell $C_0$ steadily increases in a linear fashion in response to the ramp voltage applied to the control gate 14 in accordance with constant current injection techniques.

During each programming cycle, the voltage on the floating gate 14 is represented by the following equation (equation 1)

$$V_{fg} = \alpha_d \cdot V_d + \alpha_g \cdot (V_g - \Delta V_t)$$

where $\alpha_d$ is the coupling coefficient from the drain region 12 to the floating gate 16 and where $\alpha_g$ is the coupling coefficient from the control gate 14 to the floating gate 16.

The ramp gate voltage $V_g(t)$ applied to the control gate 14 is selected to compensate for the increase in the $\Delta V_t$ term of equation 1. The $\Delta V_t$ term of equation 1 is demonstrated by FIG. 6. The ramp gate voltage $V_g(t)$ is provided by the following equation (equation 2)

$$V_g(t) = V_g(0) + \Delta V_t(0)$$

where $V_g(0)$ is the floating gate voltage at time 0, the start of the programming cycle, and where $\Delta V_t(0)$ is the rate of change of threshold voltage $V_t$ at time 0. The term $\Delta V_t(0)$ is indicated by the slope of the line corresponding to the triangle data samples in FIG. 6. This slope is preselected to match the slope of the curve corresponding to the square data samples at time 0. In other words, the rate of increase of $V_g$ is selected to maintain a linear increase in threshold voltage $V_t$ from time 0 and throughout the programming cycle.

FIG. 6 shows that a ramp gate voltage according to equation 2 applied to the control gate 14 moves the threshold voltage $V_t$ of the flash memory cell $C_0$ from approximately 2 volts to the desired approximately 5 volt level in approximately 0.22 microseconds.

The prior art constant programming voltage applied to the control gate 14, in contrast, moves the threshold voltage $V_t$ of the flash memory cell $C_0$ from approximately 2 volts to the desired approximately 5 volt level in approximately 2 microseconds.

Figure 7:
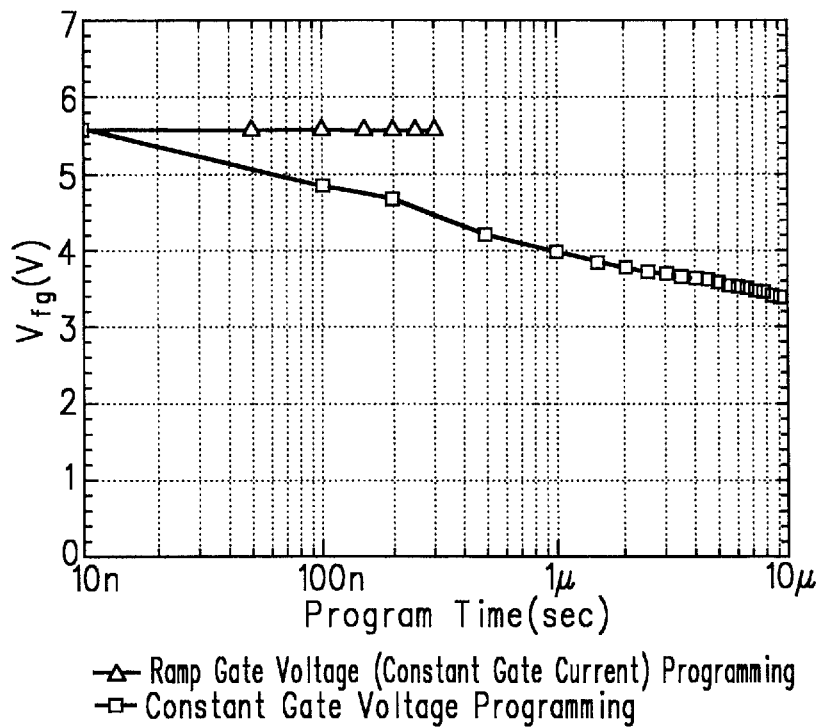
FIG. 7 illustrates the calculated voltage $V_{fg}$ on the floating gate during a programming cycle for both prior art and controlled current injection techniques.

FIG. 7 illustrates the calculated voltage $V_{fg}$ on the floating gate 16 according to equation 1 during a programming cycle for both constant and ramp functions applied to the control gate 14. The data shown corresponds to typical values of $\alpha_g$ and $\alpha_d$ of 0.6 and 0.1, respectively.

The data samples indicated by the triangles on the graph shows that a ramp voltage according to equation 2 applied to the control gate 14 yields a relatively constant level of floating gate voltage $V_{fg}$ throughout the programming cycle. Such a relatively constant level of floating gate voltage $V_{fg}$ yields a relatively constant rate of electron injection onto the floating gate 16 during the programming cycle.

The square data samples on the graph indicate that the constant voltage applied to the control gate 14 in the prior art yields a steady reduction in the floating gate voltage $V_{fg}$ during the programming cycle. Such a steadily decreasing floating gate voltage $V_{fg}$ causes migration of holes from the channel region 18 to the floating gate 16 near the drain region 12 when the electrical potential of the channel region 18 is above the electrical potential on the floating gate 16 as indicated by the square data samples on the graph. Such hole migration that occurs during many thousands of programming cycles on the flash memory $C_0$ causes surface damage to the floating gate 16.

Figure 8:
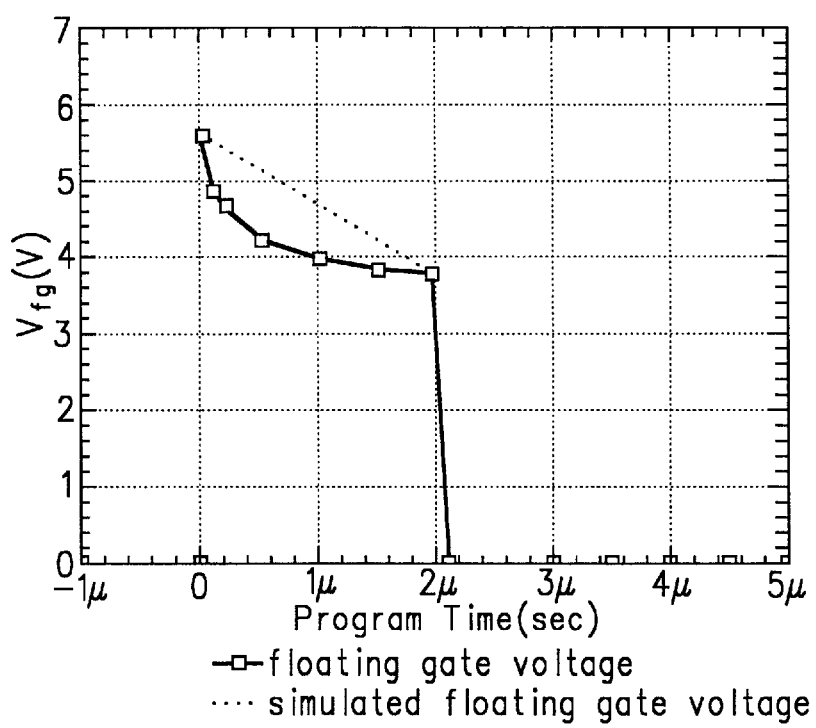
FIG. 8 illustrates the simulation of floating gate voltage $V_{fg}$ for stress experiments on a memory cell.

FIG. 8 illustrates the simulation of floating gate voltage $V_{fg}$ for stress experiments on the flash memory cell $C_0$. The stress experiments are carried out on a test cell having a structure similar to that shown in FIG. 2 but without the control gate 14 and the oxide layer 22.

The square data samples in the graph are the actual calculated levels of floating gate voltage $V_{fg}$ during the programming cycle on the flash memory cell $C_0$. The floating gate voltage $V_{fg}$ is simulated during stress experiments by a straight line approximation which is applied to the gate structure 16 of the test cell for the purposes of long-term reliability determination for the flash memory cell $C_0$.

Figure 9:
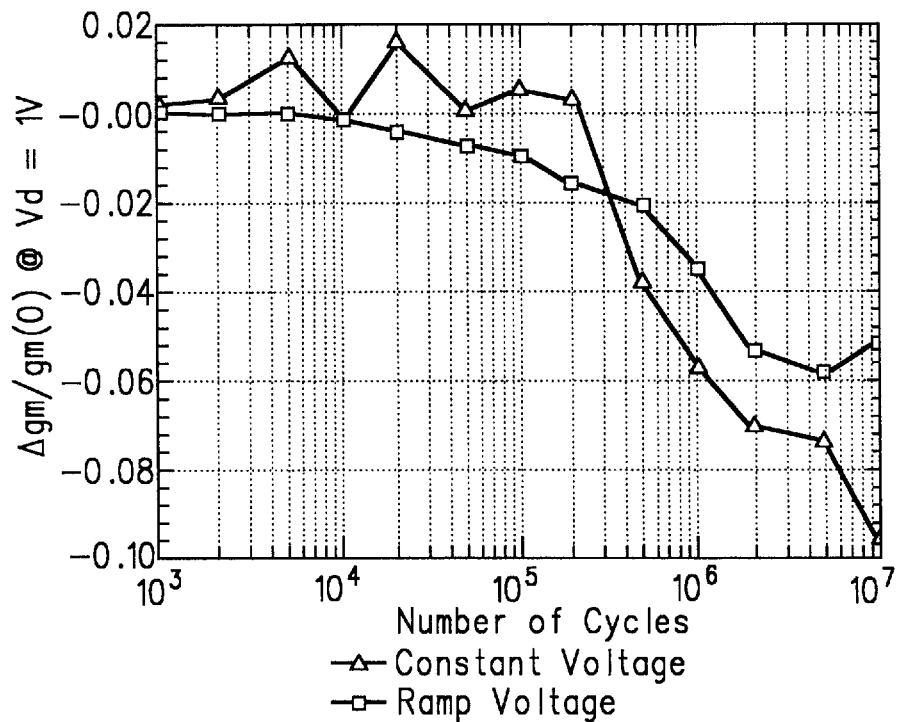
FIG. 9 illustrates the long-term degradation in transconductance of a memory cell for both prior art and controlled current injection programming techniques.

FIG. 9 illustrates the long-term degradation in transconductance of the flash memory cell $C_0$ for both constant and ramp function voltages applied to the control gate 14 during a series of test programming cycles. The transconductance $G_m$ is shown at a drain voltage $V_d$=1v. The transconductance degradation is represented by $\Delta G_m \div G_m(0)$.

The data samples represented by the squares correspond to the application of a ramp voltage $V_g$ to the control gate 14 of the flash memory cell $C_0$ during each test programming cycle. The data samples represented by the triangles on the graph correspond to the prior art application of a constant voltage level to the control gate 14 during each test programming cycle.

The triangle and square data samples indicate that early in the life of the flash memory cell the transconductance increases due to hole migration from the channel 18 onto the floating gate 16. Over time, however, the transconductance of the flash memory cell is enhanced if controlled current injection techniques are employed.

Figure 10:
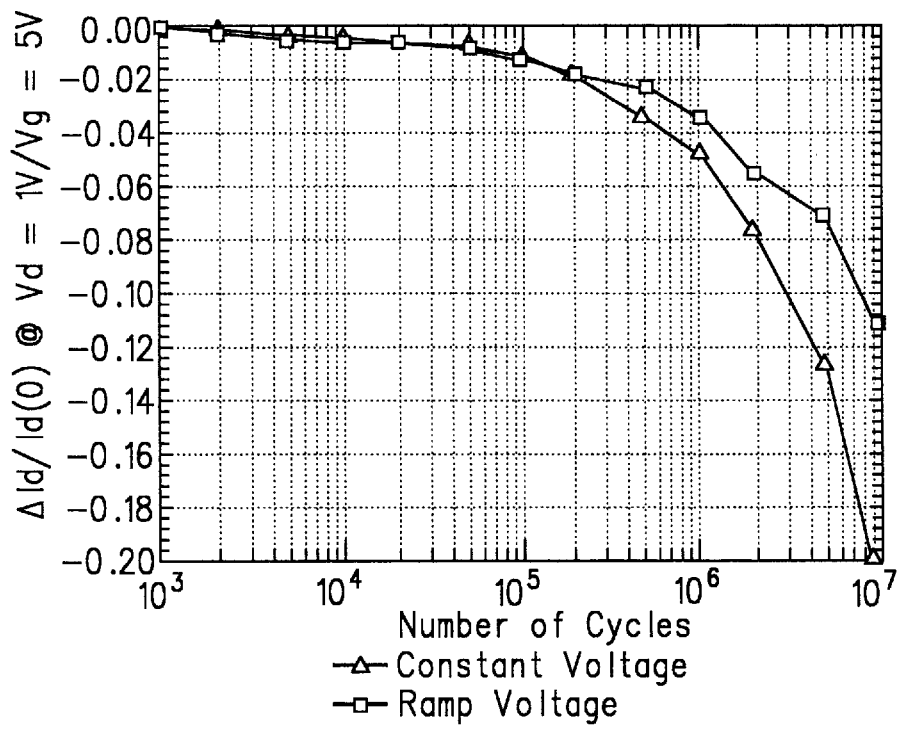
FIG. 10 illustrates the long-term read current degradation for both prior art and controlled current injection programming techniques.

FIG. 10 illustrates the read current degradation for both constant and ramp function voltages applied to the control gate 14 during a series of test programming cycles. The read current is represented by $I_d$. The degradation of read current across programming cycles is indicated by $\Delta I_d \div I_d(0)$. The data samples represented by the squares correspond to a ramp programming voltage $V_g$ and the data samples represented by the triangles correspond to the prior art application of a constant programming voltage during each test programming cycle. The triangle and square data samples indicate that, over time, the degradation in read current from the flash memory cell is reduced if a ramp programming voltage selected to achieve constant controlled current injection is employed.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A memory device, comprising:

a memory cell having a control gate having a corresponding voltage $V_g$, a floating gate formed over a substrate having a corresponding voltage $V_{fg}$, and a first region and a second region formed in the substrate with a channel region therebetween; and circuitry that applies a time-varying voltage $V_g(t)$ to the control gate during a programming cycle on the memory cell such that the time-varying voltage yields a substantially constant rate of electron flow from the channel region to the floating gate, the time-varying voltage varying throughout the programming cycle on the memory cell;

wherein said time-varying voltage $V_g(t)$ is applied such that said floating gate voltage $V_{fg}$ is represented by $\alpha_d^* V_d + \alpha_g^*(V_g - \Delta V_t)$, where $\alpha_d$ is a coupling coefficient from a drain region of one of said first and second regions to said floating gate, and $\alpha_g$ is a coupling coefficient from said control gate to said floating gate.

2. The memory device of claim 1, wherein the time-varying voltage comprises a ramp function.

3. The memory device of claim 2, wherein the time-varying voltage comprises a steadily increasing staircase function that approximates the ramp function.

4. The memory device of claim 1, wherein the time-varying voltage has a slope selected to offset the effects of electron accumulation on the floating gate during the programming cycle.

5. The memory device of claim 1, wherein:

the memory cell has a threshold voltage: and the time-varying voltage has a slope selected to maintain a linear increase in the threshold voltage throughout the programming cycle on the memory cell.

6. The memory device of claim 1, wherein:

the time varying voltage rises above 12 volts during the programming cycle on the memory cell.

7. A memory device, comprising:

a flash memory cell having, a control gate, a floating gate having a corresponding voltage $V_{fg}$;

a channel region; and a ramp voltage generator in communication with the control gate, the ramp voltage generator applies an increasing time-varying voltage $V_g(t)$ to the control gate throughout a programming cycle on the memory cell such that the time-varying voltage yields a substantially constant rate of electron flow from the channel region to the floating gate, the time-varying voltage varying throughout the programming cycle on the memory wherein said time-varying voltage $V_g(t)$ is applied such that said floating gate voltage $V_{fg}$ is represented by $\alpha_d^* V_d + \alpha_g^*(V_g - \Delta V_t)$, where $\alpha_d$ is a coupling coefficient from a drain region to said floating gate, and $\alpha_g$ is a coupling coefficient from said control gate to said floating gate.

8. The memory device of claim 7, wherein the increasing time-varying voltage comprises a ramp function.

9. The memory device of claim 7, wherein the increasing time-varying voltage comprises a steadily increasing staircase function that approximates the ramp function.

10. The memory device of claim 7, wherein:

the memory cell has a threshold voltage; and the time-varying voltage has a slope selected to maintain a linear increase in the threshold voltage throughout a programming cycle on the memory cell.

11. The memory device of claim 7, wherein: the time varying voltage rises above 12 volts during the programming cycle on the memory cell.

12. A method for programming a flash memory cell, the flash memory cell including a source, a drain, a control gate, a floating gate having a corresponding voltage $V_{fg}$; and a channel region, the method comprising the steps of:

applying a first voltage to said drain; and applying an increasing time-varying second voltage $V_g(t)$ to the control gate during a programming cycle on the flash memory cell such that the time-varying voltage yields a substantially constant rate of electron flow from the channel region to the floating gate, the second voltage varying throughout the programming cycle on the flash memory cell wherein said $V_g(t)$ is applied such that said floating gate voltage $V_{fg}$ is represented by $\alpha_d^* V_d + \alpha_g^*(V_g - \Delta V_t)$, where $\alpha_d$ is a coupling coefficient from said drain to said floating gate, and $\alpha_g$ is a coupling coefficient from said control gate to said floating gate.

13. A method according to claim 12, further including the step of:

grounding the source.

14. A method according to claim 12, wherein:

the increasing time-varying voltage comprises a ramp function.

15. A method according to claim 12, wherein:

the increasing time-varying voltage comprises a steadily increasing staircase function that approximates the ramp function.

16. A method according to claim 12, wherein:

the memory cell has a threshold voltage; and the time-varying voltage has a slope selected to maintain a linear increase in the threshold voltage throughout a programming cycle on the memory cell.

* * * * *